US012570483B2

(12) United States Patent
Kim et al.

(10) Patent No.: US 12,570,483 B2
(45) Date of Patent: Mar. 10, 2026

(54) TRANSFER FILM, TRANSFER METHOD USING TRANSFER FILM AND ELECTRONIC PRODUCTS MANUFACTURED USING TRANSFER FILM

(71) Applicants: KOREA INSTITUTE OF MACHINERY & MATERIALS, Daejeon (KR); CENTER FOR ADVANCED META-MATERIALS, Daejeon (KR)

(72) Inventors: Kwangseop Kim, Daejeon (KR); Chan Kim, Daejeon (KR); Min Ah Yoon, Daejeon (KR); Bongkyun Jang, Daejeon (KR); Jae-Hyun Kim, Daejeon (KR); Kyung-Sik Kim, Daejeon (KR); Byung-Ik Choi, Daejeon (KR)

(73) Assignees: KOREA INSTITUTE OF MACHINERY & MATERIALS, Daejeon (KR); CENTER FOR ADVANCED META-MATERIALS, Daejeon (KR)

( * ) Notice: Subject to any disclaimer, the term of this patent is extended or adjusted under 35 U.S.C. 154(b) by 492 days.

(21) Appl. No.: 17/640,728

(22) PCT Filed: Sep. 3, 2020

(86) PCT No.: PCT/KR2020/011888
§ 371 (c)(1),
(2) Date: Mar. 4, 2022

(87) PCT Pub. No.: WO2021/045543
PCT Pub. Date: Mar. 11, 2021

(65) Prior Publication Data
US 2022/0340376 A1 Oct. 27, 2022

(30) Foreign Application Priority Data
Sep. 4, 2019 (KR) ........................ 10-2019-0109387

(51) Int. Cl.
*B65G 47/90* (2006.01)
*B25J 15/00* (2006.01)
*H01L 21/683* (2006.01)

(52) U.S. Cl.
CPC ............ *B65G 47/90* (2013.01); *B25J 15/008* (2013.01); *H01L 21/6835* (2013.01); *H01L 2221/68363* (2013.01)

(58) Field of Classification Search
CPC .................. B65G 47/90; B25J 15/008; H01L 2221/68363; H01L 2221/68322; B32B 37/025; Y10T 156/1195
(Continued)

(56) References Cited

U.S. PATENT DOCUMENTS 10,744,750 B2 * 8/2020 Kim ........................ B41F 33/00

FOREIGN PATENT DOCUMENTS

KR     10-1104923 B1     1/2012
KR     10-1385443 B1     4/2014
(Continued)

OTHER PUBLICATIONS

Machine translation of KR 10-1521205 date unknown.*
(Continued)

*Primary Examiner* — John L Goff, II
(74) *Attorney, Agent, or Firm* — Hauptman Ham, LLP

(57) ABSTRACT

An embodiment of the present invention provides a transfer film that may be used for both a picking process and a placing process of an element, a transfer method using the transfer film, and an electronic product manufactured using the same. Here, the transfer film according to an embodiment of the present invention includes a base part, an adhesion part, and a first protrusion part. The adhesion part is provided on one surface of the base part, and at least part of the first protrusion part is formed and protruded on one
(Continued)

surface of the base part to be accommodated inside the adhesion part, and the thickness increases toward the first direction parallel to the surface of the base part. The first protrusion part is partitioned into a first region including a relatively thick portion of the first protrusion part and a second region including a relatively thin first protrusion part and having weaker adhesive force than the first region, and the element is picked while the first region is lifted first in the picking process, while the element is placed while the second region is lifted first in the placing process.

13 Claims, 18 Drawing Sheets

(58) Field of Classification Search
USPC .................................. 156/230, 235, 241, 249
See application file for complete search history.

(56) References Cited

FOREIGN PATENT DOCUMENTS

| KR | 10-1521205 B1 | 5/2015 |
| KR | 10-1729574 B1 | 5/2017 |
| KR | 10-2018-0029836 A | 3/2018 |
| KR | 10-2019-0065113 A | 6/2019 |

OTHER PUBLICATIONS

International Search Report mailed Dec. 17, 2020, in connection with corresponding International Patent Application No. PCT/KR2020/011888.
Written Opinion mailed Dec. 17, 2020, in connection with corresponding International Patent Application No. PCT/KR2020/011888.

* cited by examiner

TRANSFER FILM, TRANSFER METHOD USING TRANSFER FILM AND ELECTRONIC PRODUCTS MANUFACTURED USING TRANSFER FILM

CROSS-REFERENCE TO RELATED APPLICATION

The application is a national phase of PCT/KR2020/011888 filed on Sep. 3, 2020, which is based on and claims priority to Korean Patent Application No. 10-2019-0109387 filed on Sep. 4, 2019, which are incorporated herein by reference in their entireties.

TECHNICAL FIELD

The present invention relates to a transfer film, a transfer method using the transfer film, and an electronic product manufactured by using the same. More particularly, the present invention relates to a transfer film that may be used for both a picking process and a placing process of an element, a transfer method using the transfer film, and an electronic product manufactured using the same.

BACKGROUND ART

Attempts are being made to manufacture flexible element parts based on a printed electronic technology, and cases of applying them to some product groups, such as a display, an RFID, and a photovoltaic power generator are increasing. In a case of a printed electronic technology, it is generally performed at a relatively low temperature or room temperature compared to a semiconductor process, and the elements are manufactured by a coating process, a printing process, a patterning process, etc., and the flexible parts may be obtained through a post-process for formation of wiring and an electrode and processes such as bonding or cutting.

In the case of actually manufacturing a device using the element, a space for the wiring and other uses is required. In other words, a space is required between the elements, and when all elements arranged on a wafer are transferred at once, the space between these elements cannot be formed, which leads to difficulties in the device manufacturing.

In addition, when the device is composed of several types of elements rather than a single type of element, other elements must be transferred in the vicinity thereof after transcribing one element. As can be seen from this example, in the transfer process for the device manufacturing, there are many cases requiring the process of selectively transcribing the elements, and in the transfer process, a technique for making such selective transfer using a stamp with a pattern is already known.

In the picking process of transcribing the elements on a source substrate to the stamp, adhesion between the stamp and the element must be managed so that the adhesion between the stamp and the element is greater than that between the source substrate and the element. And, in the placing process of transcribing the element adhered to the stamp to the target substrate, the adhesive force between the stamp and the element must be managed to be smaller than the adhesive force between the target substrate and the element.

Therefore, in general, for the picking process and the placing process, there is a problem that the stamp suitable for picking and the stamp suitable for placing must be used, respectively. This is a problem that may also occur in the selective transfer process that selectively transcribes the elements.

DISCLOSURE

Technical Problem

One aspect of the present invention is to provide a transfer film that may be used for both the picking (Picking) process and the placing (Placing) process of the element, a transfer method using the transfer film, and an electronic product manufactured using the same.

Further, the technical object to be achieved by the present invention is not limited to the aforementioned technical object, and other unmentioned technical objects will be obviously understood by those skilled in the art from the description below.

Technical Solution

An embodiment of the present invention provides a transfer film including: a base part; an adhesion part provided on one surface of the base part; and an asymmetric first protrusion part that is protruded from the surface of the base part to be accommodated inside the adhesion part and has at least a portion of which a thickness increases toward a first direction parallel to the surface of the base part, wherein the first protrusion part is partitioned into a first region including a relatively thick portion of the first protrusion part and a second region including a relatively thin first protrusion part and having weaker adhesive force than the first region, and the element is picked while the first region is lifted first in the picking process, while the element is placed while the second region is lifted first in the placing process.

In an embodiment of the present invention, the first protrusion part may include a first inclined surface whose thickness increases toward the first direction.

In an embodiment of the present invention, the rear end of the element may be positioned inside the first projection region formed by projecting the first protrusion part onto one surface of the adhesion part based on the first direction.

In an embodiment of the present invention, the first protrusion part may have a first flat surface formed at the rear end of the first inclined surface based on the first direction, and the first flat surface may have a slope of 0 and a length that is shorter than the length of the first direction of the element.

In an embodiment of the present invention, an asymmetrical second protrusion part protruded and formed adjacent to the first protrusion part to be accommodated inside the adhesion part and having a second inclined surface whose thickness decreases toward the first direction may be further included, the second protrusion part may be divided into a third region including a relatively thick portion and a fourth region including a relatively thin portion of the second protrusion part and having a weaker adhesive force than the third region, and the element may be picked while the third region is lifted first in the picking process, and the element is placed while the fourth region is lifted first in the placing process.

In an embodiment of the present invention, the front end of the element may be positioned inside the second projection region formed by the projection of the second protrusion part onto one surface of the adhesion part based on the first direction.

In an embodiment of the present invention, the second protrusion part may have a second flat surface formed at the front end of the second inclined surface based on the first direction, and the second flat surface may have a slope of 0 and a length that is shorter than the length of the first direction of the element.

In an embodiment of the present invention, the first protrusion part may have a first step surface whose thickness increases stepwise in the first direction.

In an embodiment of the present invention, the first protrusion part may have a first parabolic surface whose thickness increases in a parabolic shape toward the first direction.

In an embodiment of the present invention, a second protrusion part formed continuously with the first parabolic surface and having a second parabolic surface whose thickness decreases in a parabolic form toward the first direction may be further included, the first protrusion part may be divided into a first region including a portion with a relatively thick thickness on the first parabolic surface, and a second region including another portion with a relatively thin thickness on the first parabolic surface and having a weaker adhesive force than the first region, and the element may be picked while the first region is lifted first in the picking process, while the element may be placed while the second region is lifted first in the placing process.

In an embodiment of the present invention, the rear end of the element may be positioned inside the first projection region formed by projecting the first parabolic surface onto one surface of the adhesion part based on the first direction.

In an embodiment of the present invention, the first parabolic surface and the second parabolic surface may be formed symmetrical to each other.

On the other hand, an embodiment of the present invention provides a transfer method using a transfer film including: preparing of a transfer film, picking in which the element of the source substrate is in close contact with the adhesion part to face the first protrusion part, and the first region is lifted first so that the element is transferred to the adhesion part; and placing in which the element adhered to the adhesion part is in close contact with the target position of the target substrate, and the second region is lifted first so that the element is transferred to the target substrate.

In an embodiment of the present invention, first aligning in which the rear end of the element is aligned to be positioned inside a first projection region formed by projecting the first protrusion part onto one surface of the adhesion part based on the first direction may be further included after the preparing of the transfer film, and the picking may proceed in a state that the adhesion part presses the element with a constant load.

In an embodiment of the present invention, second aligning in which the element adhered to the adhesion part is aligned to the target position may be further included before the placing, and the placing may be performed in a state that the adhesion part presses the element to the target position with a constant load.

On the other hand, an embodiment of the present invention provides a transfer method using a transfer film including: preparing of a transfer film, picking in which the first element of the source substrate faces the first inclined surface, the second element of the source substrate faces the second inclined surface to be in close contact with the adhesion part, and the first region is lifted first so that only the first element is transcribed to the adhesion part; and placing in which the first element adhered to the adhesion part is in close contact with the target position of the target substrate, and the second region is lifted first so that the first element is transferred to the target substrate.

On the other hand, an embodiment of the present invention provides a transfer method using a transfer film including: preparing of a transfer film, picking in which the element of the source substrate is in close contact with the adhesion part to face the first parabolic surface, and the first region is lifted first so that the element is transferred to the adhesion part; and placing in which the element adhered to the adhesion part is in close contact with the target position of the target substrate, and the second region is lifted first so that the element is transferred to the target substrate.

Further, an embodiment of the present invention provides an electronic product manufactured by the transfer method using the transfer film.

Advantageous Effects

According to an embodiment of the present invention, the asymmetric protrusion part whose thickness increases in the direction parallel to the surface of the base part is provided so that the adhesive force of the adhesion part is different for each region, and the rotation direction of the adhesion part is changed while the element is in close contact with the adhesion part, thereby performing the picking process and the placing process even with one transfer film.

In addition, according to an embodiment of the present invention, the protrusion part of which the thickness increases and decreases in the same direction is provided so that the adhesive force of the adhesion part is different for each region, and the rotation direction of the adhesion part is changed while the element is in close contact with the adhesion part, thereby the selective transfer of the element may be possible.

The effects of the present invention are not limited to the foregoing effects, and it shall be understood that the effect of the present invention includes all of the effects inferable from the detailed description of the present invention or the configuration of the invention described in the claims.

MODE FOR INVENTION

Figure 1:
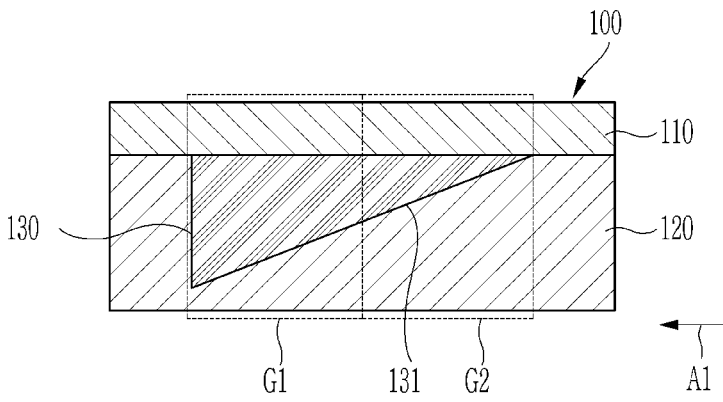
FIG. 1 is a view showing a transfer film according to a first embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

In addition, unless explicitly described to the contrary, the word "comprise", and variations such as "comprises" or "comprising", will be understood to imply the inclusion of stated elements but not the exclusion of any other elements.

FIG. 1 is a view showing a transfer film according to a first embodiment of the present invention.

As shown in FIG. 1, the transfer film 100 may include a base part 110, an adhesion part 120, and a first protrusion part 130.

The base part 110 may form the base of the transfer film 100.

The base part 110 may be formed of a flexible material. When the transfer film 100 is used in a plate-type transfer device, the base part 110 can be attached to a plate-shaped stamp in a plate shape. Also, when the transfer film 100 is used in a roller-type transfer device, the base part 110 may be attached to the external circumferential surface of the roller.

The adhesion part 120 may be provided on one surface of the base part 110. The adhesion part 120 may have an adhesive force, and may cause an element to be transcribed to be adhered.

The first protrusion part 130 may be formed to be protruded on one surface of the base part 110 and may be accommodated on the inside of the adhesion part 120.

The first protrusion part 130 may have a first inclined surface 131 whose thickness increases toward the first direction A1 parallel to the surface of the base part 110. Accordingly, the first protrusion part 130 may be formed in an asymmetrical shape.

The transfer film 100 may be partitioned into a first region G1 and a second region G2.

The first region G1 may be a region including a relatively thick portion of the first protrusion part 130. In addition, the second region G2 may be a region including other portions having a relatively thin thickness among the first protrusion parts 130, and the adhesive force in the second region G2 may be weaker than the adhesive force in the first region G1.

Since the first region G1 includes the relatively thick portion of the first protrusion part 130, the thickness of adhesion part 120 in the first region G1 may be relatively thinner than the thickness of adhesion part 120 in the second region G2.

The adhesive force on the adhesion part 120 is inversely proportional to the thickness of the adhesion part 120. That is, the thicker the thickness of the adhesion part 120, the smaller the adhesive force, and the thinner the thickness of the adhesion part 120, the greater the adhesive force. Therefore, the adhesive force in the first region G1 is greater than the adhesive force in the second region G2.

In the present invention, it is possible to pick or place the element by using this difference in the adhesive force in the first region G1 and the second region G2, and in the following, a method of picking or placing the element by using the transfer film is described.

Figure 2:
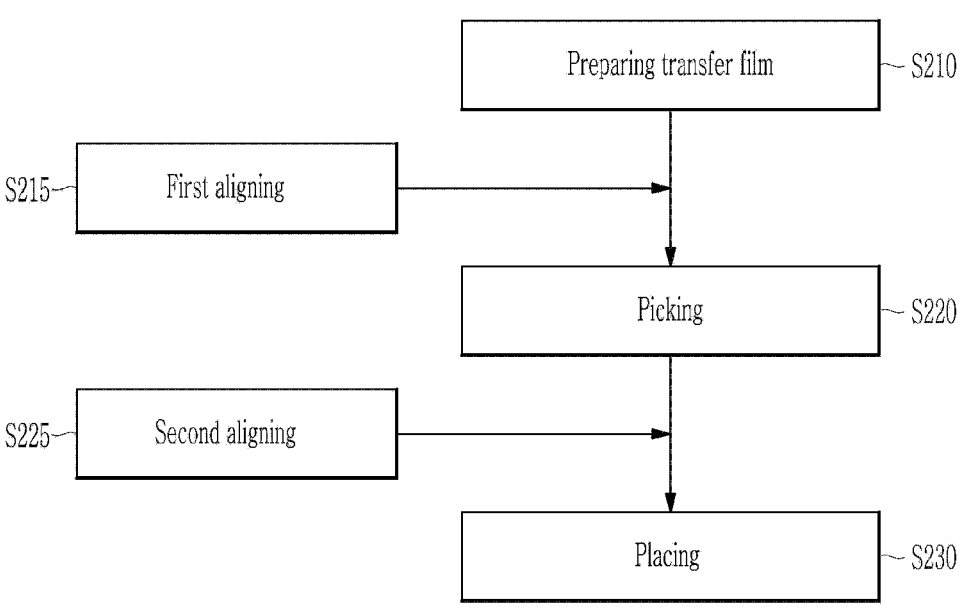
FIG. 2 is a flowchart showing a transfer method using a transfer film of FIG. 1.
Figure 3:
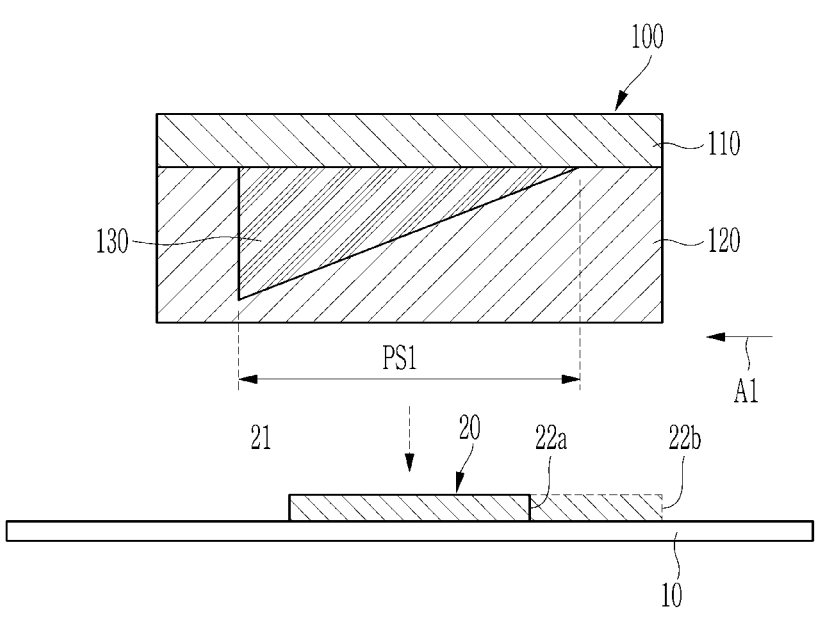
FIG. 3 and FIG. 4 are views to explain a picking process among a transfer method using a transfer film of FIG. 2.
Figure 4:
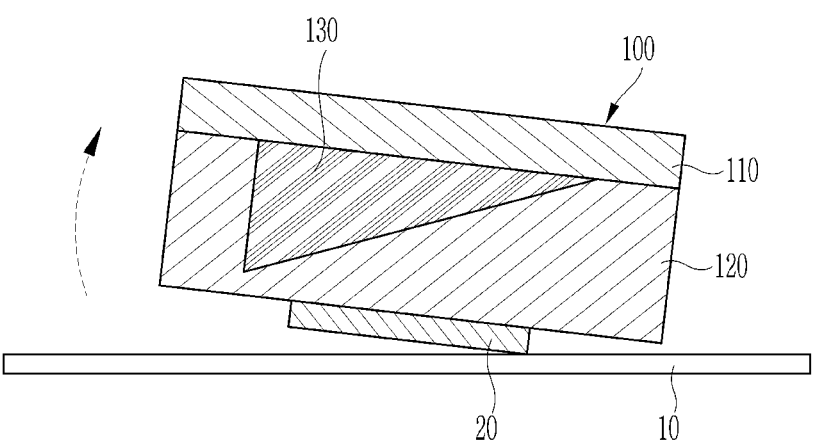
Figure 5:
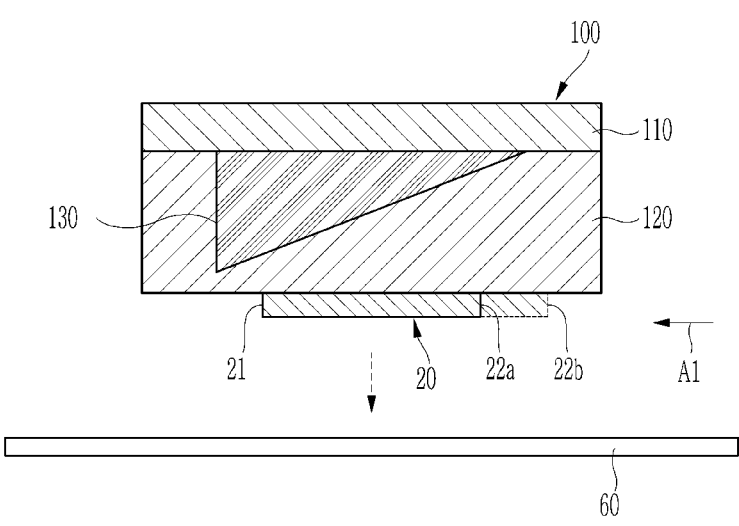
FIG. 5 and FIG. 6 are views to explain a placing process among a transfer method using a transfer film of FIG. 2.
Figure 6:
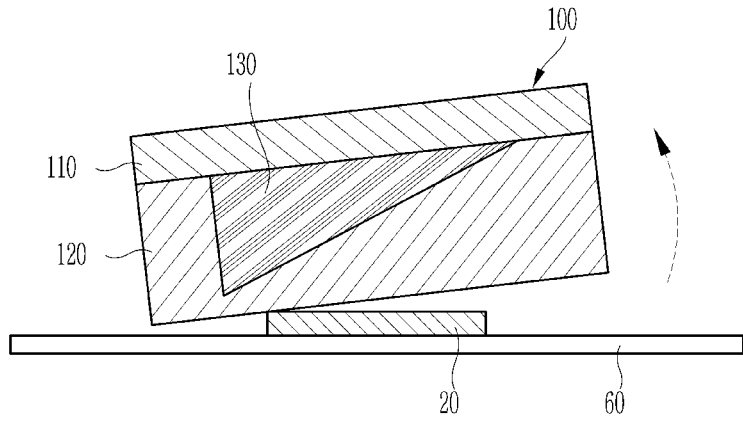

FIG. 2 is a flowchart showing a transfer method using a transfer film of FIG. 1, FIG. 3 and FIG. 4 are views to explain a picking process among a transfer method using a transfer film of FIG. 2, and FIG. 5 and FIG. 6 are views to explain a placing process among a transfer method using a transfer film of FIG. 2.

As shown in FIG. 1 to FIG. 6, a transfer method using the transfer film may include a providing step (S210) of a transfer film, a picking step (S220), and a placing step (S230).

The providing step (S210) of the transfer film may be a step of preparing the above-described transfer film.

Also, the transfer method using the transfer film may include a first aligning step (S215) after the providing step (S210) of the transfer film.

Referring to FIG. 3, the first aligning step S215 is an aligning step so that the rear end 21 of the element 20 is positioned inside the first projection region PS1 formed by projecting the first protrusion part 130 onto one side of the adhesion part 120 based on the first direction A1.

In the first aligning step S215, the rear end 21 of the element 20 must be positioned inside the first projection region PS1, however the front end 22a of the element 20 may be positioned inside the first projection region PS1, or the front end 22b of the element 20 may be positioned outside the first projection region PS1.

The picking step S220 may be a step in which the element 20 of the source substrate 10 is in close contact with the adhesion part 120 so as to face the first inclined surface 131, and the first region G1 is lifted first so that the element 20 is transcribed to the adhesion part 120.

That is, as shown in FIG. 4, when the adhesion part 120 adheres to the element 20, the adhesive force between adhesion part 120 and the element 20 in the first region G1 is greater than the adhesive force between the adhesion part 120 and the element 20 in the second region G2, and preferably, the adhesive force between the adhesion part 120 and the element 20 in the first region G1 is greater than the adhesive force between the element 20 and the source substrate 10. Therefore, when the first region G1 of the transfer film 100 is lifted first, the element 20 adheres to the adhesion part 120 and is separated from the source substrate 10 to be transcribed to the adhesion part 120. The picking step (S220) may be performed while the adhesion part 120 presses the element 20 with a constant load.

Also, the transfer method using the transfer film may include a second aligning step (S225) before the placing step (S230).

Referring to FIG. 5, the second aligning step S225 may be a step of aligning the element 20 adhered to the adhesion part 120 to the target position.

The placing step (S230) may be a step in which the element 20 adhered to the adhesion part 120 is in close contact with the target position of the target substrate 60, and the second region G2 is lifted first so that the element 20 is transcribed to the target substrate 60.

That is, as shown in FIG. 6, the transfer film 100 may be in contact with the element 20 to bring it to the target position of the target substrate 60 while the element 20 is adhered to the adhesion part 120.

As described above, the rear end 21 of the element 20 adhered to the adhesion part 120 is positioned inside the first projection region PS1. When the element 20 is in close contact with the target substrate 60, even if the front end 22a of the element 20 is positioned inside the first projection region PS1, or the front end 22b of the element 20 is positioned outside the first projection region PS1, in the second region G2, the adhesive force between the adhesion part 120 and the element 20 is less than the adhesive force between the element 20 and the target substrate 60. Therefore, when the second region G2 of the transfer film 100 is lifted first, the element 20 adheres to the target substrate 60 and is separated from the adhesion part 120 to be transferred to the target substrate 60. The placing step (S230) may be performed while the adhesion part 120 presses the element 20 to the target position with a predetermined load.

Therefore, according to the present embodiment, one transfer film 100 is used, but the element 20 may be picked or placed according to the rotation direction of the transfer film 100.

When the transfer film 100 is applied to a plate-type transfer device, the picking process and the placing process of the element may be selectively performed by controlling the tilting direction of the stamp to which the transfer film 100 is attached. And, when the transfer film 100 is applied to a roller type of transfer device, the picking process and the placing process of the element may be selectively performed by controlling the rotation direction of the roller to which the transfer film 100 is attached.

Figure 7:
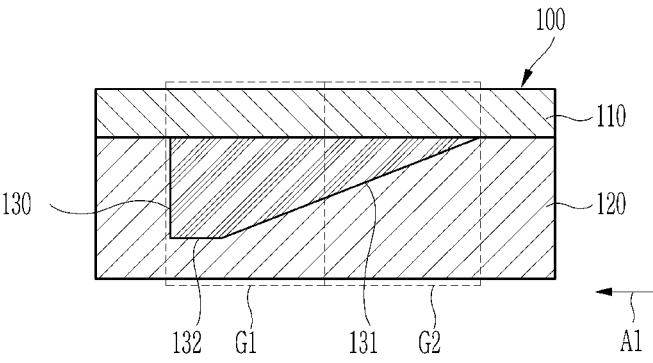
FIG. 7 is a view showing another example of a transfer film of FIG. 1.

FIG. 7 is a view showing another example of a transfer film of FIG. 1.

As shown in FIG. 7, the first protrusion part 130 may further have a first flat surface 132 formed at the rear end of the first inclined surface 131 based on the first direction A1.

The first flat surface 132 may have a slope of 0 and may have a length that is shorter than the length of the first direction A1 of the element to be transferred. The first flat surface 132 may make the adhesive force constant in some regions of the first region G1, so that the element may be more stably transferred to the adhesion part 120 during the picking process.

Figure 8:
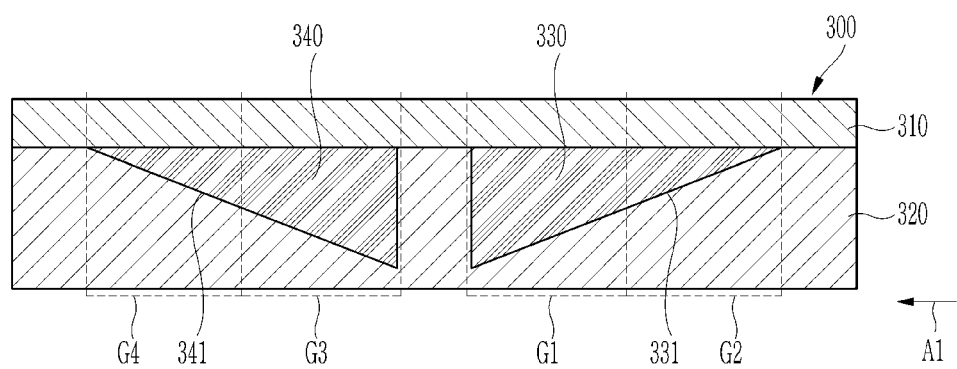
FIG. 8 is a view showing a transfer film according to a second embodiment of the present invention.
Figure 9:
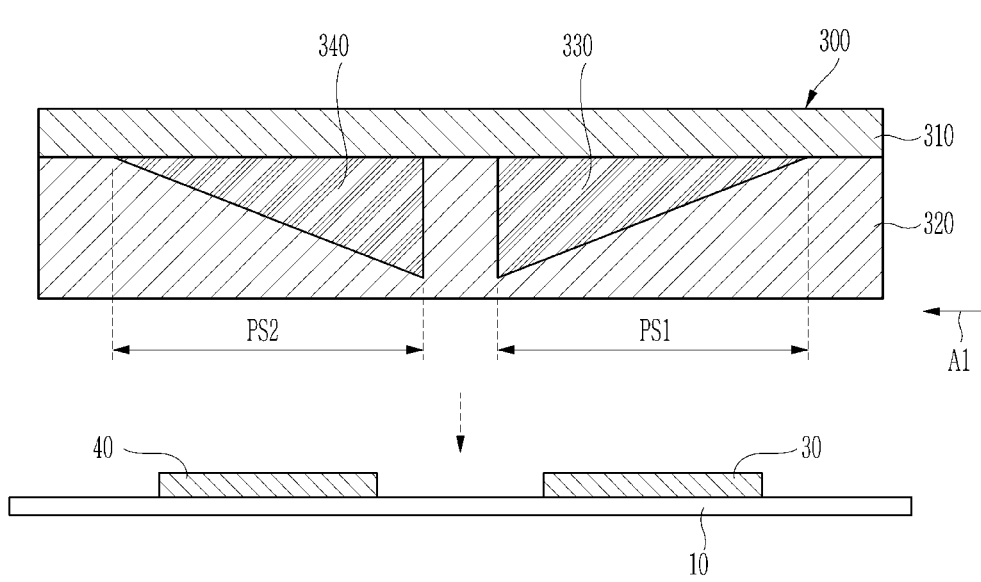
FIG. 9 and FIG. 10 are views to explain a picking process among a transfer method using a transfer film of FIG. 8.
Figure 10:
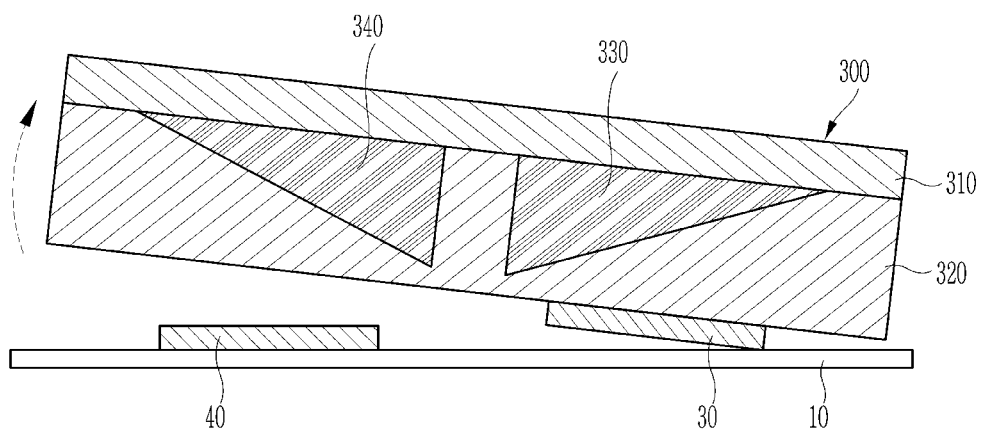
Figure 11:
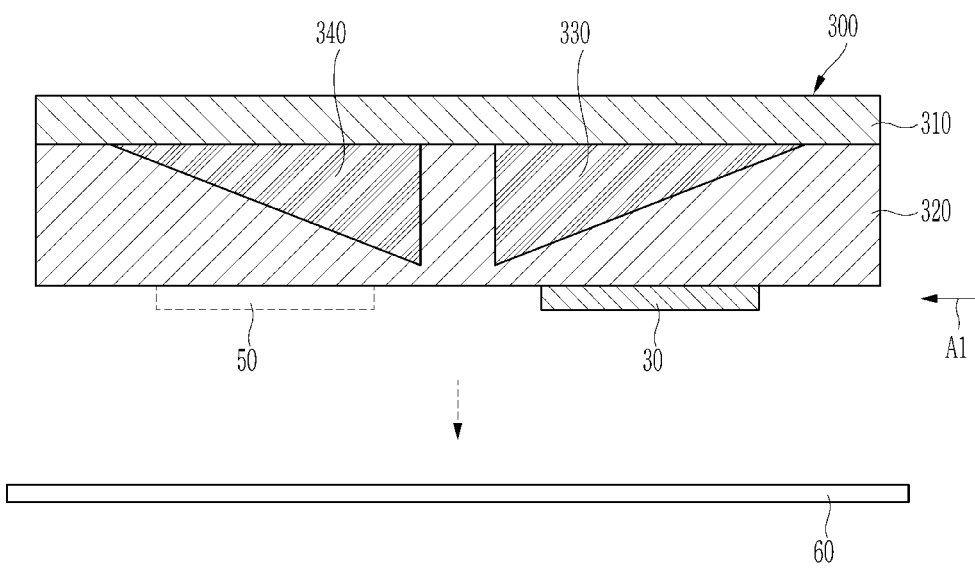
FIG. 11 and FIG. 12 are views to explain a placing process among a transfer method using a transfer film of FIG. 8.
Figure 12:
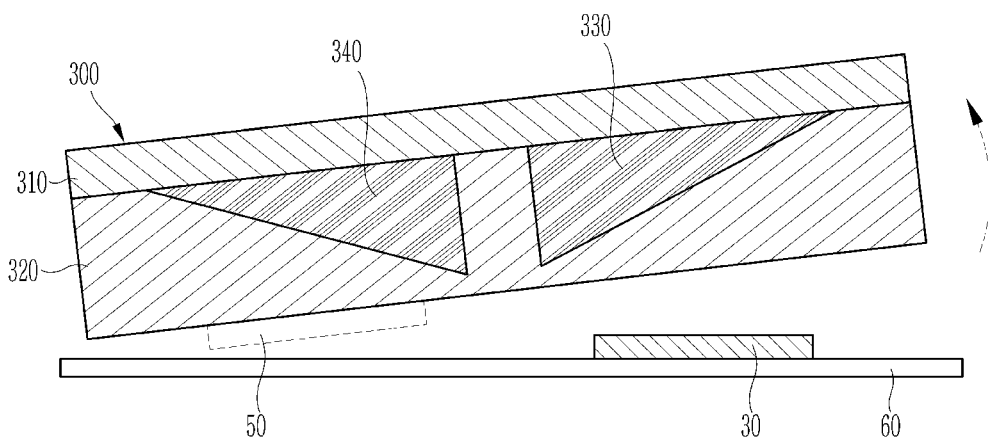

FIG. 8 is a view showing a transfer film according to a second embodiment of the present invention, FIG. 9 and FIG. 10 are views to explain a picking process among a transfer method using a transfer film of FIG. 8, and FIG. 11 and FIG. 12 are views to explain a placing process among a transfer method using a transfer film of FIG. 8.

First, as shown in FIG. 8, the transfer film 300 according to the present embodiment may include a base part 310, an adhesion part 320, a first protrusion part 330, and a second protrusion part 340.

The base part 310, the adhesion part 320, and the first protrusion part 330 are substantially the same as the base part 110, the adhesion part 120, and the first protrusion part 130 of the above-described first embodiment, and thus the descriptions thereof are omitted.

The second protrusion part 340 may be protruded and formed on the base part 310 adjacent to the first protrusion part 330 and accommodated inside the adhesion part 320. The second protrusion part 340 may be formed to be spaced apart from the first protrusion part 330, but it is not limited thereto and may be formed to be connected thereto.

The second protrusion part 340 may have a second inclined surface 341 whose thickness decreases toward the first direction A1, and thus, the second protrusion part 340 may be formed in an asymmetrical shape. The second protrusion part 340 may be formed symmetrically with the first protrusion part 330.

The transfer film 300 may be partitioned into a third region G3 and a fourth region G4, along with the first region G1 and the second region G2. The third region G3 may be a region including a relatively thick portion of the second protrusion part 340. In addition, the fourth region G4 may be a region including a portion of the second protrusion part 340 having a relatively thin thickness, and the adhesive force in the fourth region G4 may be weaker than the adhesive force in the third region G3.

Since the third region G3 includes the relatively thick portion of the second protrusion part 340, the thickness of the adhesion part 320 in the second region G2 may be relatively thinner than the thickness of the adhesion part 320 in the fourth region G4. The third region G3 may correspond to the first region G1, and the fourth region G4 may correspond to the second region G2.

The transfer method using the transfer film described in the first embodiment above may be equally applied to the present embodiment.

That is, as shown in FIG. 9 and FIG. 10, during the picking process, the first element 30 of the source substrate 10 may be in close contact with the adhesion part 320 to face the first inclined surface 331, and the second element 40 of the source substrate 10 may be in close contact with the adhesion part 320 to face the second inclined surface 341.

At this time, the rear end of the first element 30 may be positioned inside the first projection region PS1 formed by projecting the first protrusion part 330 onto one surface of the adhesion part 320 with respect to the first direction A1, and the front end of the second element 40 may be positioned inside the second projection region PS2 formed by projecting the second protrusion part 340 onto one surface of the adhesion part 320 with respect to the first direction A1.

In addition, the first region G1 of the first protrusion part 330 may be lifted first, so that the first element 30 is transcribed to the adhesion part 320. In this case, since the fourth region G4 is lifted first in the second protrusion part 340, the second element 40 is not transferred to the adhesion part 320 and remains on the source substrate 10.

On the other hand, by allowing the third region G3 of the second protrusion part 340 to be lifted first, the second element 40 may be transcribed into the adhesion part 320. In this case, since the second region G2 is lifted first in the first protrusion part 330, the first element 30 remains on the source substrate 10 without being transferred to the adhesion part 320.

Also, as shown in FIG. 11 and FIG. 12, during the placing process, the first element 30 adhered to the adhesion part 320 may be brought into close contact with the target position of the target substrate 60, and the second region G2 may be lifted first so that the first element 30 may be transferred to the target substrate 60. At this time, even if the third element 50 is further adhered to the adhesion part 320, the third element 50 may not be transferred to the target substrate 60.

On the other hand, if the third element 50 is to be transferred to the target substrate 60, the fourth region G4 may be lifted first so that the third element 50 is transferred to the target substrate 60. In this case, the first element 30 may not be transferred to the target substrate 60.

Through this method, some of the elements of the source substrate may be selectively picked, and some of the elements attached to the adhesion part may be selectively placed to the target substrate.

Although not shown, even in the present embodiment, the second protrusion part 340 may further have a second flat surface formed on the front end of the second inclined surface 341 with reference to the first direction A1. In addition, the second flat surface may have a slope of 0 and the length that is shorter than the length of the first direction A1 of the second element 40.

Figure 13:
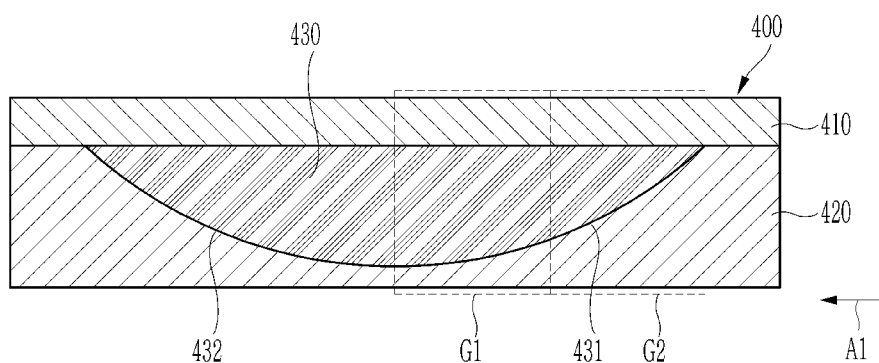
FIG. 13 is a view showing a transfer film according to a third embodiment of the present invention.
Figure 14:
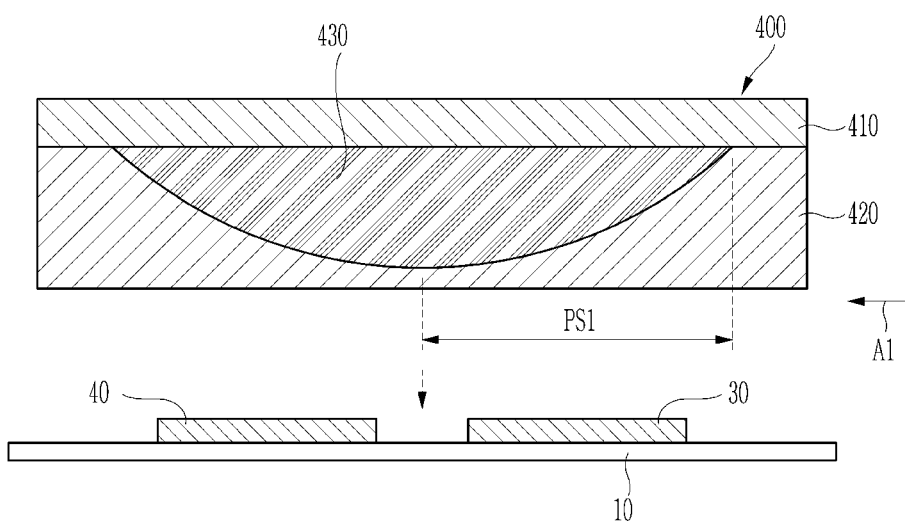
FIG. 14 and FIG. 15 are views to explain a picking process among a transfer method using a transfer film of FIG. 13.
Figure 15:
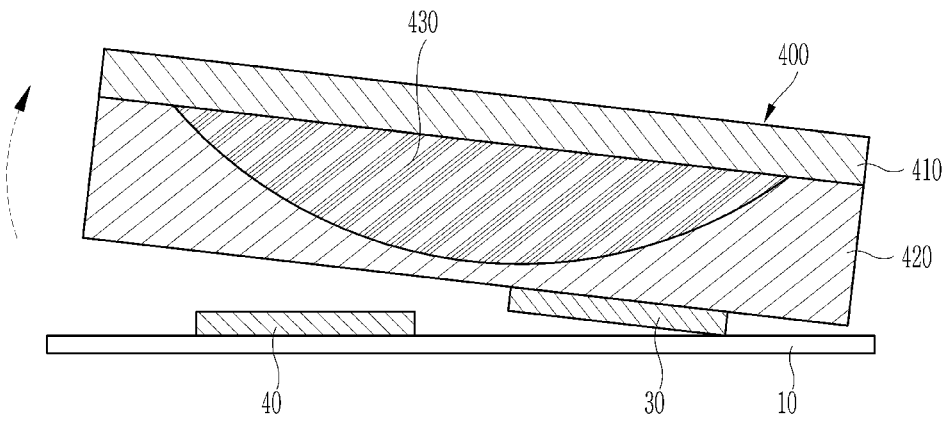
Figure 16:
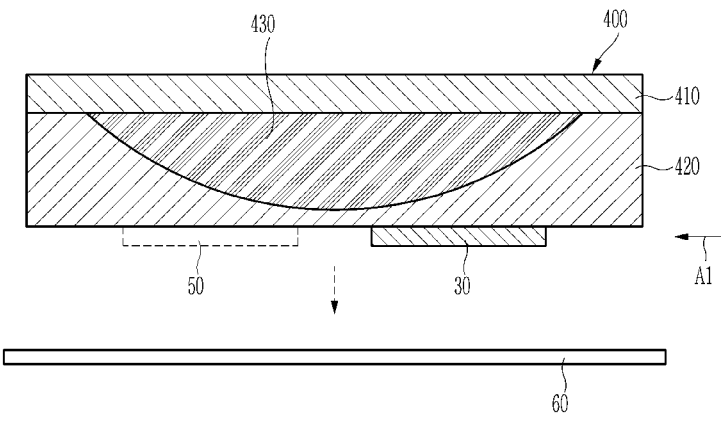
FIG. 16 and FIG. 17 are views to explain a placing process among a transfer method using a transfer film of FIG. 13.
Figure 17:
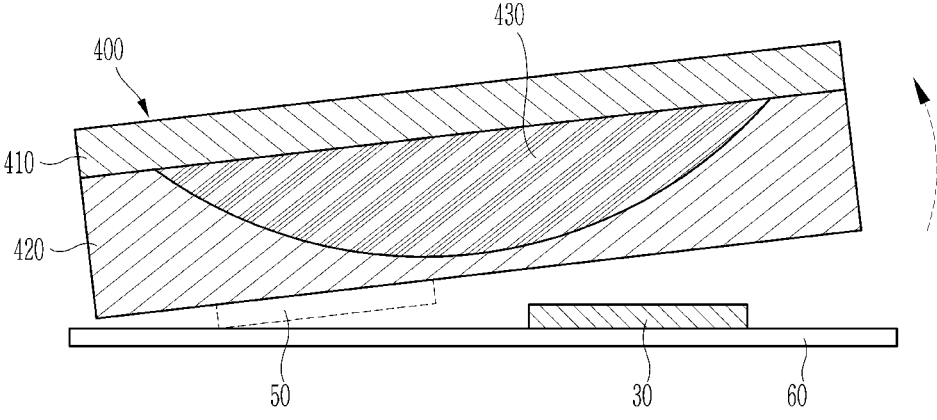

FIG. 13 is a view showing a transfer film according to a third embodiment of the present invention, FIG. 14 and FIG. 15 are views to explain a picking process among a transfer method using a transfer film of FIG. 13, and FIG. 16 and FIG. 17 are views to explain a placing process among a transfer method using a transfer film of FIG. 13. In the present embodiment, the protrusion part may be in the shape of an ellipse having a parabola, and since other configurations are the same as in the above-described second embodiment, the repeated contents are omitted as much as possible.

First, as shown in FIG. 13, the transfer film 400 according to the present embodiment may include the base part 410, the adhesion part 420, and the protrusion part 430.

Since the base part 410 and the adhesion part 420 are substantially the same as the base part 110 and the adhesion part 120 of the first embodiment described above, the descriptions thereof are omitted.

The protrusion part 430 is formed and protruded on one surface of the base part 410 and may be accommodated on the inside of the adhesion part 420. In the present embodiment, the protrusion part 430 may include a first protrusion part having a first parabolic surface 431 of which the thickness increases with a parabolic shape toward the first direction A1 parallel to the surface of the base part 410 and a second protrusion part formed continuously with the first parabolic surface 431 and having a second parabolic surface 432 of which the thickness decreases with the parabolic shape toward the first direction A1. The first parabolic surface 431 and the second parabolic surface 432 may be formed symmetrically.

The transfer film 400 may be partitioned into a first region G1 and a second region G2. The first region G1 may be a region including a relatively thick portion of the first parabolic surface 431. In addition, the second region G2 may be a region that includes other parts with relatively thin thickness among the first parabolic surface 431, and the adhesive force in the second region G2 may be weaker than the adhesive force in the first region G1.

In addition, the transfer film 400 may be partitioned into a third region (not shown) including a relatively thick portion of the second parabolic surface 432 and a fourth region (not shown) including a relatively thin portion of the second parabolic surface 432.

Also, the transfer method using the transfer film described in the previous second embodiment may be equally applied to the present embodiment.

That is, as shown in FIG. 14 and FIG. 15, during the picking process, the first element 30 of the source substrate 10 may be in close contact with the adhesion part 420 to face the first parabolic surface 431, and the second element 40 of the source substrate 10 may be in close contact with the adhesion part 420 to face the second parabolic surface 432.

The rear end of the first element 30 may be positioned inside the first projection region PS1 formed by projecting the first parabolic surface 431 onto one surface of the adhesion part 420 with respect to the first direction A1. In addition, the front end of the second element 40 may be positioned inside the second projection region formed by projecting the second parabolic surface 432 onto one surface of the adhesion part 420.

In addition, the first region G1 of the first parabolic surface 431 may be lifted first, so that the first element 30 is transferred to the adhesion part 420. In this case, since the fourth region G4 is lifted first on the second parabolic surface 432, the second element 40 remains on the source substrate 10 without being transferred to the adhesion part 420.

Also, as shown in FIG. 16 and FIG. 17, during the placing process, the first element 30 adhered to the adhesion part 420 may be in close contact with the target position of the target substrate 60, and the second region G2 may be lifted first so that the first element 30 is transcribed to the target substrate 60. At this time, even if the third element 50 is further adhered to the adhesion part 420, the third element 50 may not be transferred to the target substrate 60. Through this method, some of the elements of the source substrate may be selectively picked, and some of the elements attached to the adhesion part may be selectively placed onto the target substrate.

Figure 18:
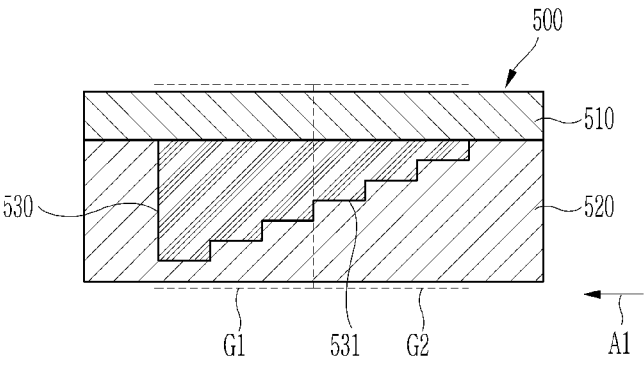
FIG. 18 is a view showing a transfer film according to a fourth embodiment of the present invention.

FIG. 18 is a view showing a transfer film according to a fourth embodiment of the present invention. In the present embodiment, the protrusion part may have a shape having a step surface, and since other configurations are the same as in the above-described first embodiment, the repeated contents are omitted as much as possible.

As shown in FIG. 18, the transfer film 500 according to the present embodiment may include the base part 510, the adhesion part 520, and the first protrusion part 530.

The base part 510 and the adhesion part 520 are substantially the same as the base part 110 and the adhesion part 120 of the above-described first embodiment, and thus the descriptions thereof are omitted.

The first protrusion part 530 is formed and protruded on one surface of the base part 510 and may be accommodated inside the adhesion part 520. In the present embodiment, the first protrusion part 530 may have a first step surface 531 in which the thickness gradually increases toward the first direction A1. That is, since the thickness of the first step surface 531 is constant toward the first direction A1, the thickness of the first protrusion part 530 may increase intermittently rather than continuously toward the first direction A1.

In addition, the transfer film 500 may be partitioned into a first region G1 and a second region G2, and the adhesive force in the second region G2 may be weaker than the adhesive force in the first region G1.

The transfer method using the transfer film described in the first embodiment above can be equally applied to the present embodiment. In addition, as described in the second embodiment, the transfer film 500 may further include a second protrusion part (not shown) symmetric to the first protrusion part 530.

On the other hand, an electronic product manufactured using the transfer method using the transfer film according to the present invention may include finished products including televisions, monitors, mobile phones, etc., as well as intermediate electronic products including a semiconductor module on which the transferred element is mounted, a substrate on which the semiconductor module is mounted, and a panel on which the substrate is mounted.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

| | |
|---|---|
| 10: source substrate | 20: element |
| 60: target substrate | 100, 300, 400, 500: transfer film |
| 110, 310, 410, 510: base part | 120, 320, 420, 520: adhesion part |
| 130, 330, 530: first protrusion part | 131: first inclined surface |
| 132: first flat surface | 331: first inclined surface |
| 340: second protrusion part | 341: second inclined surface |
| 430: protrusion part | 431: first parabolic surface |
| 432: second parabolic surface | 531: first step surface |
| G1: first region | G2: second region |

The invention claimed is:

1. A transfer film comprising:

a base part;

an adhesion part provided on one surface of the base part; and an asymmetric first protrusion part protruded from the surface of the base part, accommodated inside the adhesion part and having at least a portion of which a thickness increases toward a first direction parallel to the surface of the base part, wherein the first protrusion part is partitioned into a first region including a first portion of the first protrusion part and a second region including a second portion of the first protrusion part and having a weaker adhesive force than the first region, and a thickness of the first portion of the first protrusion part is greater than a thickness of the second portion of the first protrusion part, an end side of the first protrusion part perpendicular to the surface of the base part is in contact with the adhesion part in the first direction, the end side having a greatest thickness, one protrusion part corresponds to one element to be picked, an element is picked while the first region is lifted first in a picking process, and the element is placed while the second region is lifted first in a placing process, and a first projection region formed by projecting the first protrusion part onto one surface of the adhesion part contacts with a rear end of the element based on the first direction during the picking process.

2. The transfer film of claim 1, wherein the first protrusion part includes a first inclined surface whose thickness increases toward the first direction.

3. The transfer film of claim 2, wherein the first protrusion part has a first flat surface formed at a rear end of the first inclined surface based on the first direction, the first flat surface has a slope of 0 and a length that is shorter than a length of the first direction of the element.

4. The transfer film of claim 1, wherein the first protrusion part has a first step surface whose thickness increases stepwise in the first direction.

5. The transfer film of claim 1, wherein the first protrusion part has a first parabolic surface whose thickness increases in a parabolic shape toward the first direction.

6. The transfer film of claim 5, further comprising a second protrusion part having a second parabolic surface whose thickness decreases in a parabolic form toward the first direction.

7. A transfer film comprising:

a base part;

an adhesion part provided on one surface of the base part;

an asymmetric first protrusion part protruded from the surface of the base part, accommodated inside the adhesion part and having at least a portion of which a thickness increases toward a first direction parallel to the surface of the base part, an asymmetrical second protrusion part protruded and formed adjacent to the first protrusion part to be accommodated inside the adhesion part and having a second inclined surface whose thickness decreases toward the first direction, wherein the first protrusion part is partitioned into a first region including a first portion of the first protrusion part and a second region including a second portion of the first protrusion part and having a weaker adhesive force than the first region, and a thickness of the first portion of the first protrusion part is greater than a thickness of the second portion of the first protrusion part, the second protrusion part is divided into a third region including a third portion and a fourth region including a fourth portion of the second protrusion part and having a weaker adhesive force than the third region, and a thickness of the third portion of the second protrusion part is greater than a thickness of the fourth portion of the second protrusion part, the first protrusion part and the second protrusion part are disposed at a predetermined space, one protrusion part corresponds to one element to be picked, an element is picked while the third region is lifted first in a picking process, and the element is placed while the fourth region is lifted first in a placing process, the first protrusion part includes a first inclined surface whose thickness increases toward the first direction, and a second projection region formed by projecting the second protrusion part onto one surface of the adhesion part contacts with a front end of the element based on the first direction during the picking process.

8. The transfer film of claim 7, wherein the second protrusion part has a second flat surface formed at a front end of the second inclined surface based on the first direction, and the second flat surface has a slope of 0 and a length that is shorter than a length of the first direction of the element.

9. A transfer method using a transfer film comprising:

preparing of a transfer film of claim 1;

picking in which an element of a source substrate is in close contact with the adhesion part to face the first protrusion part, and the first region is lifted first so that the element is transferred to the adhesion part; and placing in which the element adhered to the adhesion part is in close contact with a target position of a target substrate, and the second region is lifted first so that the element is transferred to the target substrate.

10. The transfer method using the transfer film of claim 9, further comprising first aligning in which a rear end of the element is aligned to be positioned inside a first projection region formed by projecting the first protrusion part onto one surface of the adhesion part based on the first direction after the preparing of the transfer film, and the picking proceeds in a state that the adhesion part presses the element with a constant load.

11. The transfer method using the transfer film of claim 9, further comprising second aligning in which the element adhered to the adhesion part is aligned to the target position before the placing, and the placing is performed in a state that the adhesion part presses the element to the target position with a constant load.

12. A transfer method using a transfer film comprising:

preparing of a transfer film of claim 7;

picking in which a first element of a source substrate faces the first inclined surface, a second element of the source substrate faces the second inclined surface to be in close contact with the adhesion part, and the first region is lifted first so that only the first element is transcribed to the adhesion part; and placing in which the first element adhered to the adhesion part is in close contact with a target position of a target, and the second region is lifted first so that the first element is transferred to a target substrate.

13. A transfer method using a transfer film comprising:

preparing of a transfer film of claim 6;

picking in which an element of a source substrate is in close contact with the adhesion part to face the first parabolic surface, and the first region is lifted first so that the element is transferred to the adhesion part; and placing in which the element adhered to the adhesion part is in close contact with a target position of a target substrate, and the second region is lifted first so that the element is transferred to the target substrate.

* * * * *